United States Patent
Shrader et al.

(10) Patent No.: US 6,665,230 B1
(45) Date of Patent: Dec. 16, 2003

(54) PROGRAMMABLE DELAY COMPENSATION CIRCUIT

(75) Inventors: Steven Shrader, Boise, ID (US); Art Gmurowski, Rochester, MI (US); Samitinjoy Pal, Fremont, CA (US); Michael McKeon, Cedar Park, TX (US)

(73) Assignee: Denali Software, Inc., Palo Alto, CA (US)

( * ) Notice: Subject to any disclaimer, the term of this patent is extended or adjusted under 35 U.S.C. 154(b) by 0 days.

(21) Appl. No.: 10/211,691

(22) Filed: Jul. 31, 2002

Related U.S. Application Data

(60) Provisional application No. 60/322,538, filed on Sep. 14, 2001.

(51) Int. Cl.$^7$ ................................................. G11C 8/00
(52) U.S. Cl. ........................................ 365/233; 365/194
(58) Field of Search ................................... 365/194, 233

(56) References Cited

U.S. PATENT DOCUMENTS 6,571,308 B1 * 5/2003 Reiss et al. .................. 710/315
6,593,575 B2 * 7/2003 Fries ...................... 250/363.03

OTHER PUBLICATIONS

*DDR SDRAM Functionality and Controller Read Data Capture*, DesignLine, Micron Technology Inc. vol. 8, Issue 3, pp. 1–24 3Q99.

* cited by examiner

*Primary Examiner*—M. Tran
(74) *Attorney, Agent, or Firm*—Fenwick & West LLP

(57) ABSTRACT

Circuitry for programming the amount of delay applied to an input signal, the circuitry performing the method of determining the number of delay elements required to capture a clock cycle, receiving a programmable delay value and calculating the number of delay elements required to delay a clock signal by the received delay value and delaying the clock signal by the number of delay elements required to delay the clock signal by the programmable delay value.

21 Claims, 13 Drawing Sheets

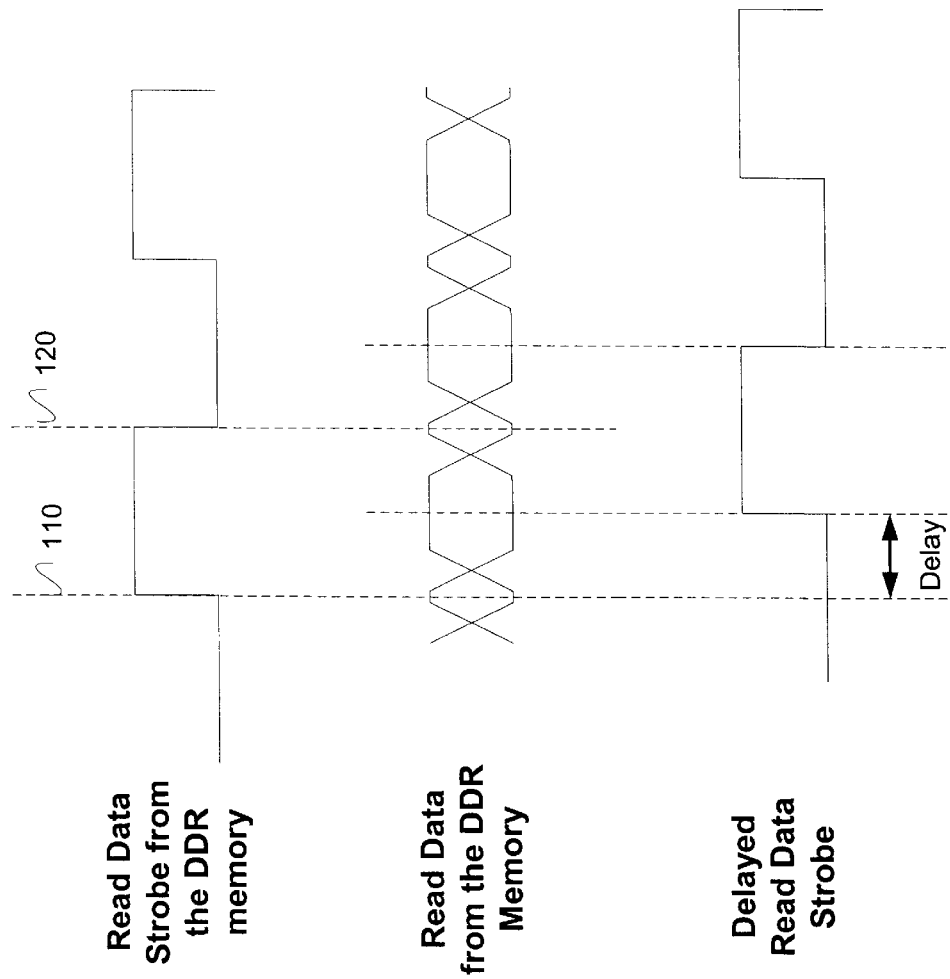

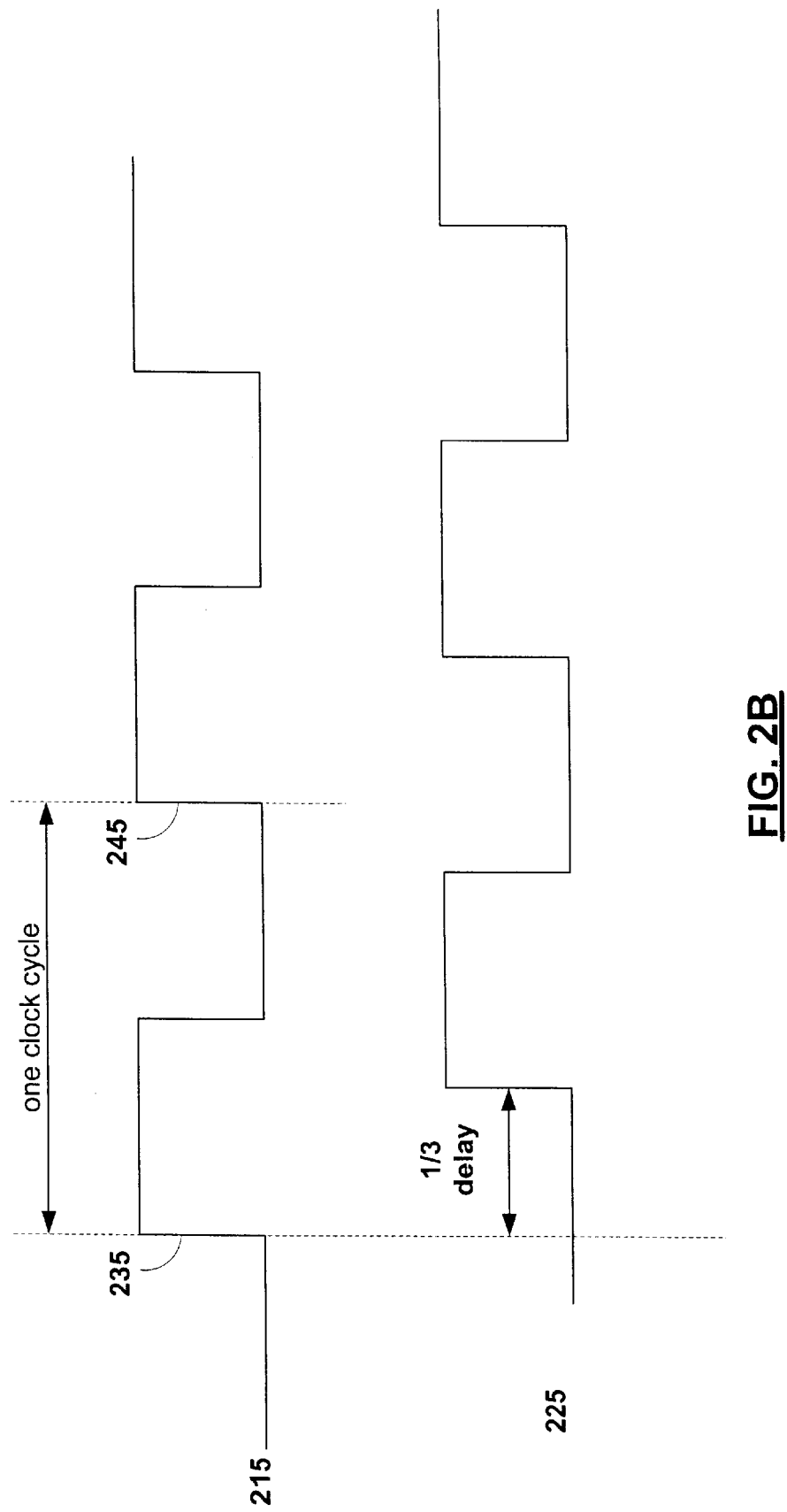

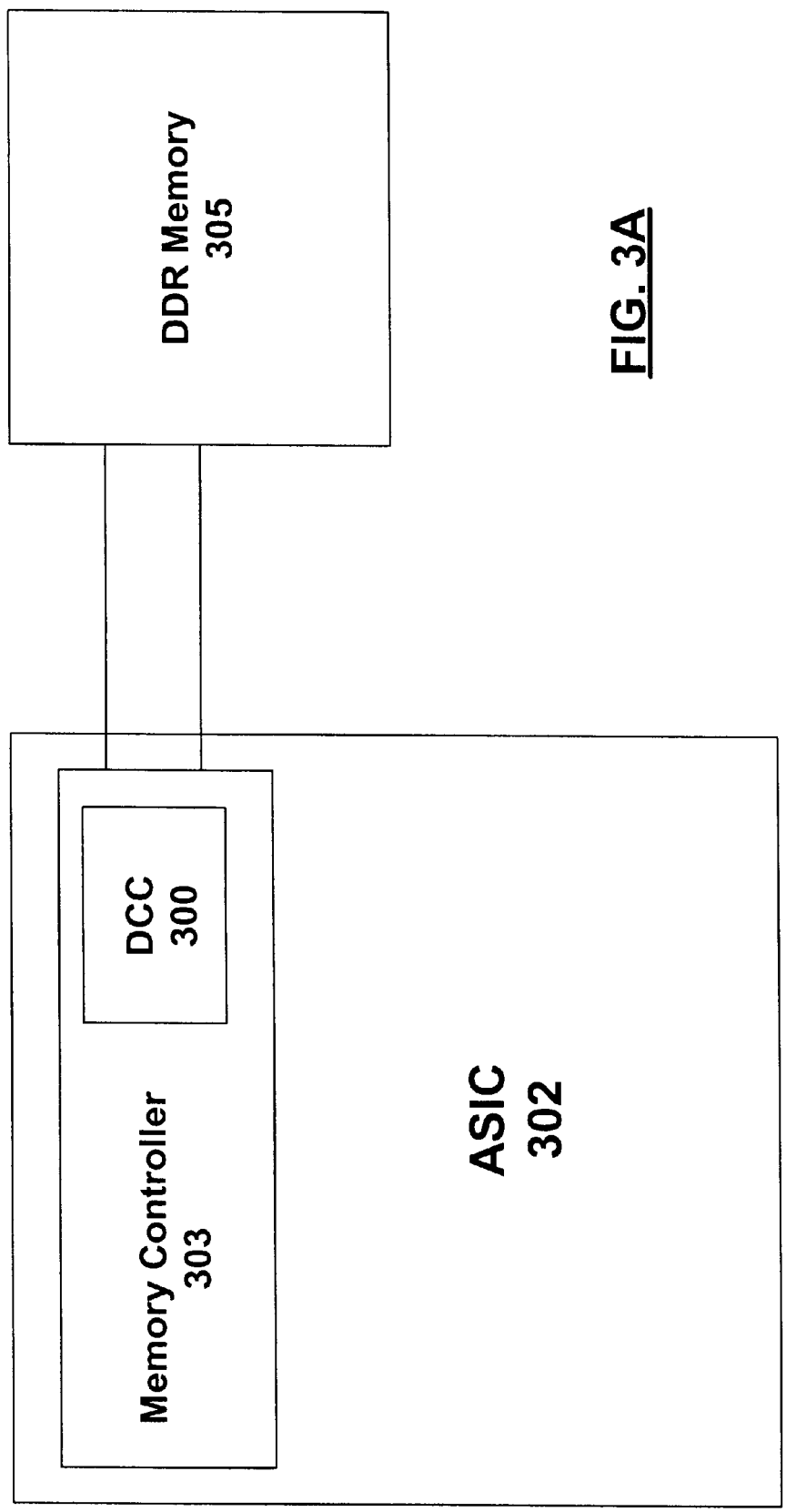

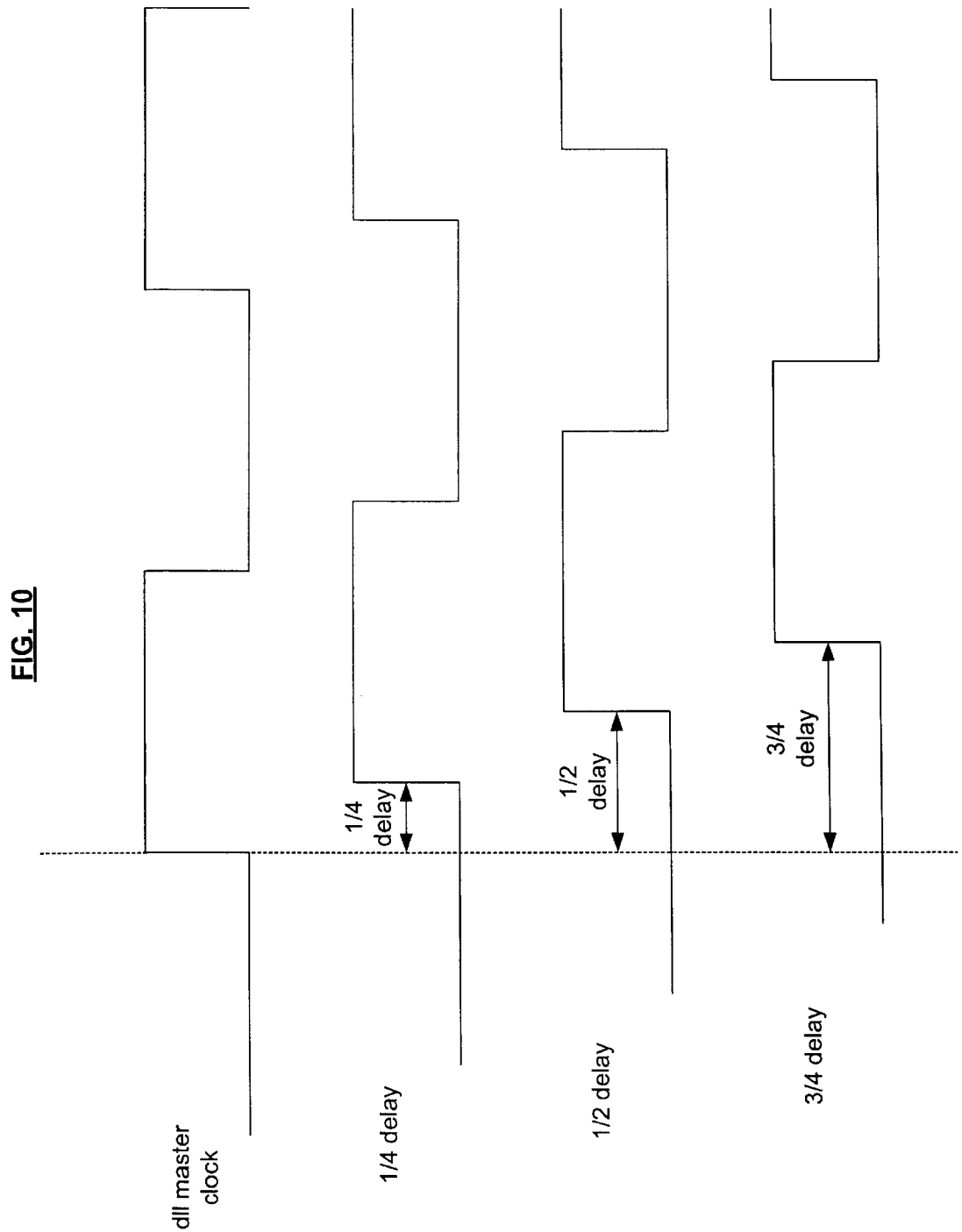

PROGRAMMABLE DELAY COMPENSATION CIRCUIT

CROSS-REFERENCE TO RELATED APPLICATIONS

This application claims priority under 35 U.S.C. § 119(e) to U.S. Provisional Patent Application Serial No. 60/322,538, "Delay Compensation Circuit for Capturing and Sending DDR Memory Device Data," by Steven Shrader, Art Gmurowski, Samitinjoy Pal and Michael McKeon, filed Sep. 14, 2001.

This application is related to co-pending U.S. patent application Ser. No. 10/210,858, "Input/Output Cells for a Double Data Rate (DDR) Memory Controller," by Steven Shrader, Art Gmurowski, Samitinjoy Pal and Michael McKeon, filed Jul. 31, 2002, which is herein incorporated by reference.

BACKGROUND OF THE INVENTION

1. Field of the Invention

The present invention relates to delaying data strobe signals to register incoming data on both edges of the strobe and to send write data and write data strobes to be captured by another device.

2. Description of the Related Art

Double data rate (DDR) memory devices read and write data on both the positive and negative edges (transitions) of a clock signal. Thus, DDR memory provides twice the data rate of memory devices that only read and write data on the positive edge of a clock signal. Along with the increased bandwidth, the DDR memory substantially increases the complexity of the memory subsystem. Since two data words are now sent every clock cycle as opposed to one in a single data rate device, the data eye, or window during which the data can reliably be captured, is significantly reduced. For example, FIG. 1A illustrates a clock signal and a data trace for a single data rate memory and a double data rate memory. As illustrated, the single data rate memory reads/writes one word per clock cycle while the double data rate device reads/writes two words per clock cycle. Thus, the data eye for data in a single data rate memory is much larger than the data eye for data from a double data rate memory. This aspect of the DDR design significantly increases the complexity of the timing considerations for reading and writing data to and from the DDR memory.

A memory controller can be used to interface between the DDR memory and an application specific integrated circuit (ASIC). The memory controller is used to interface to the DDR memory by providing the write data, write data strobe and other write commands to the DDR memory with the appropriate timing relationships such that the data can be reliably written to memory. The memory controller can also be used to capture read data received from the DDR memory during a read operation.

When data is written to a DDR memory, a write data strobe and the corresponding write data are sent to the DDR memory. The DDR memory uses the write data strobe to capture the write data so that it can be written to memory. The DDR memory assumes that the write data strobe is aligned with the data eye of the write data, therefore, the memory controller must output the write data strobe and the write data to the DDR memory with the appropriate timing relationship. This can be accomplished by delaying a clock signal in the memory controller, which has the same frequency as the DDR memory clock, so that the clock aligns with the data eye of the write data. The delayed clock signal is then output of the controller as the write data strobe along with the write data. It is assumed that the wires for the write data and the associated write data strobe are routed with the same length between the controller and the DDR memory device to ensure proper timing when the signals reach the DDR memory.

To reduce complexity, DDR memory devices typically require the write data strobe to arrive at the DDR memory within some percentage of the rising edge of the master clock for the DDR memory. Typically, DDR memory devices require the write data strobe to arrive at the DDR memory within ¼ of the rising edge of the DDR master clock. For this reason, the amount of delay applied to the write data strobe depends on the distance the signal must travel from the memory controller to the DDR memory device. This distance is often referred to as flight time. Often times, this requirement requires the design of the DCC to be specialized for each ASIC board design since board designs typically vary in the amount of flight time between the memory controller and the DDR memory. This is inefficient and costly.

During a read operation, the memory controller recieves read data along with a read data strobe from the DDR memory. The DDR memory sends the read data strobe coincident with the read data. In other words, the rising edge of the read data strobe arrives at the memory controller at the same time that the read data is in transition. In order to reliably capture the read data, the memory controller needs to align the read data strobe with the data eye of the read data.

FIG. 1B illustrates the relationship between the read data strobe and the read data in greater detail. The rising and falling edges 110 and 120 of the read data strobe sent by the DDR memory are not aligned with the data eye of the read data. Instead, the rising and falling edges occur when the read data is in transition. In order to reliably capture the data, the read data strobe must be delayed so that the rising and falling edges of the read data strobe are aligned with the data eye of the read data.

Since the read data strobe and the read data are coincident when sent from the DDR memory, it is assumed that the wires for the data and the associated read data strobe are routed with the same length between the controller and the DDR memory device. In other words, the controller assumes that the read data strobe and the read data are coincident when they are received at the controller. If they are not coincident, the delay applied by the controller may not align the read data strobe with the data eye of the read data. This will reduce the reliability of the read data capture.

In order to align the read data strobe with the data eye of the read data, the read data strobe needs to be delayed in the memory controller. The amount of delay applied to the read data strobe depends on the type of DDR memory device being used. The data eye during which the read data can be captured varies for different DDR memory devices. Some devices specify the data eye more towards the rising edge than the falling edge and vice versa. Thus, the amount of delay that needs to be applied to the read data strobe varies for different DDR memory devices. Again, to meet these design requirements, the delay circuitry must often be redesigned for each type of DDR memory that is used in the memory subsystem.

What is needed is a delay circuit that can be programmed to provide varying amounts of delay to read and write data strobes depending on the board design and DDR memory that is being used in a particular application. Such a delay circuit would allow the memory controller to be reused across different board designs, thus saving development time and costs.

SUMMARY OF THE INVENTION

The present invention relates to circuitry for delaying a clock signal according to a delay value that can be programmed external to the circuitry. The delay locked loop (DCC) of the described embodiment determines the number of delay elements required to capture a clock cycle of a clock signal. The DCC uses the number of delay elements and a received programmable delay value to determine how many delay elements are required to delay the clock signal by the programmable delay value. The DCC delays the clock signal by passing the clock signal through the number of delay elements needed to delay the clock signal by the programmable delay value.

In one embodiment, the delay circuitry is used in a memory controller to interface with a DDR memory. The delay circuitry is used to delay a read data strobe received from the DDR memory coincident with the read data during a read operation. The read data strobe is delayed by a received programmable delay value so that the rising and falling edges of the read data strobe align with the data eye of the read data. In another embodiment, the delay circuitry is used to delay an internal clock signal in a memory controller that has the same frequency as the master clock of a DDR memory the memory controller is interfacing with. The delayed master clock is the write data strobe sent to the DDR memory with the write data during a write operation. The rising edge of the write data strobe is aligned with the data eye of the write data so that the DDR memory can reliably capture the write data.

One advantage of the present invention is that the programmable nature of the DCC allows the ASIC to be used with varying board designs and memory devices. The delay applied by the DCC is programmed to compensate for the flight time between the memory controller and the DDR memory. Another advantage of the present invention is that the delay values are updated in the DCC when the DDR DRAM memory is in a refresh cycle. During the refresh cycle, no data strobes are delayed in the DCC. As a result, the DCC does not introduce jitter or glitch into the delayed data strobes. This significantly reduces the complexity of the circuitry by eliminating the need for special analog circuitry to monitor for the introduction of jitter or glitch into the delayed data strobes.

BRIEF DESCRIPTION OF THE DRAWINGS

FIGS. 1A and 1B illustrate clock traces and data traces for a single data rate memory and for a double data rate memory.

FIG. 2B is a trace of clock signal 215 and the same clock signal delayed by ⅓ of a clock cycle 225.

FIG. 3A is a block diagram illustrating the interface between ASIC 302 and DDR Memory 305 through Memory Controller 303.

FIG. 10 is an illustration of DCC master clock, DCC master clock delayed by ¼ of a clocy cycle, DCC master clock delayed by ½ of a clock cycle, and DCC master clock delayed by ¾ of a clock cycle.

DETAILED DESCRIPTION OF THE PREFERRED EMBODIMENTS

Figure 2A:
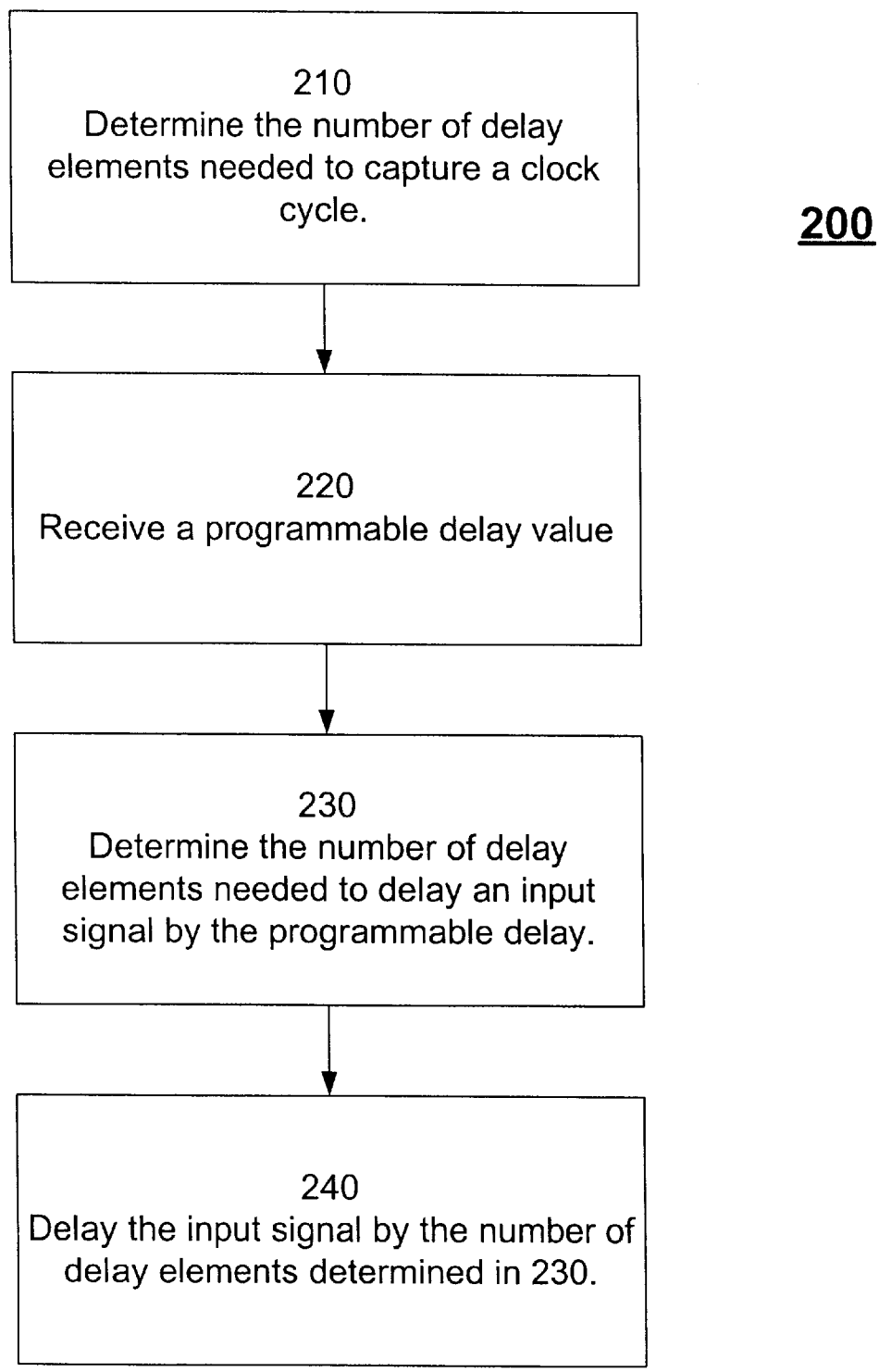
FIG. 2A is a flow diagram illustrating a method 200 for delaying a clock signal according to a programmable delay parameter.

FIG. 2A is a flow diagram illustrating a method 200 for delaying a clock signal according to a programmable delay parameter according to the present invention. In step 210, the number of delay elements needed to capture a clock cycle is determined. A clock cycle is defined as that portion of a clock signal falling between two consecutive rising edges of a clock signal. For example, FIG. 2B illustrates clock signal 215. A clock cycle of clock signal 215 is shown as that portion of the clock between rising edge 235 and rising edge 245. The delay equal to a clock cycle can be determined by passing the clock signal through a series of delay elements and comparing the first rising edge of the delayed clock signal with the second rising edge of the original clock signal. When the two rising edges are aligned, the number of delay elements the delayed clock signal passed through is the number of delay elements needed to delay the clock signal by one clock cycle.

In step 220, a programmable delay value is received. The programmable delay value can be received from a number of sources. In a preferred embodiment, the programmable delay is received from a programmable register that is capable of accepting a programmable delay value from a user or program. This programmable delay value is defined as a fraction of the clock period. This fraction is used in conjunction with the number of delay elements needed to capture an entire clock period to determine the amount of delay that needs to be applied to an input data strobe signal.

In step 230, the number of delay elements needed to delay an clock signal is determined based on the programmable delay fraction and the number of delay elements determined in step 210. Referring again to FIG. 2B, clock signal 215 and delayed clock signal 225 are illustrated. Suppose that a delay value of ⅓ is received as the programmable delay value and that twelve delay elements are required to capture a clock cycle of clock signal 215. Multiplying these values together (12*⅓=4), indicates that 4 delay elements are needed to delay the clock signal by ⅓. Thus, clock signal 215 is passed through four delay elements to delay clock signal 215 by ⅓, resulting in clock signal 225. If the number of delay elements is calculated to be a fraction of a whole number, then the number is rounded to provide the closest whole number of delay elements.

Going back to FIG. 2A, in step 240, the clock signal is delayed by the delay value programmed into the delay apparatus. The clock signal is delayed by passing the clock signal through the number of delay elements calculated in step 230 above. An example of a delay element is a logic gate, such as a buffer, AND gate, etc. However, one skilled in the art will recognize that there are many devices that can be used as delay elements. It should be noted that any electrical signal can be delayed by the delay apparatus including the system clock, read and write data strobes and read data.

FIG. 3A illustrates a DDR memory 305 and an application specific integrated circuit (ASIC) 302 comprising a memory controller 303. Memory controller 303 interfaces between ASIC 302 and DDR memory 305 to handle the read and write operations between the DDR memory 305 and ASIC 302. Memory controller 303 includes a delay compensation circuit (DCC) 300 according to the present invention. DCC 300 is used to delay incoming read data strobes and outgoing write data strobes so that data can reliably be read from and written to DDR memory 305.

Figure 1A:
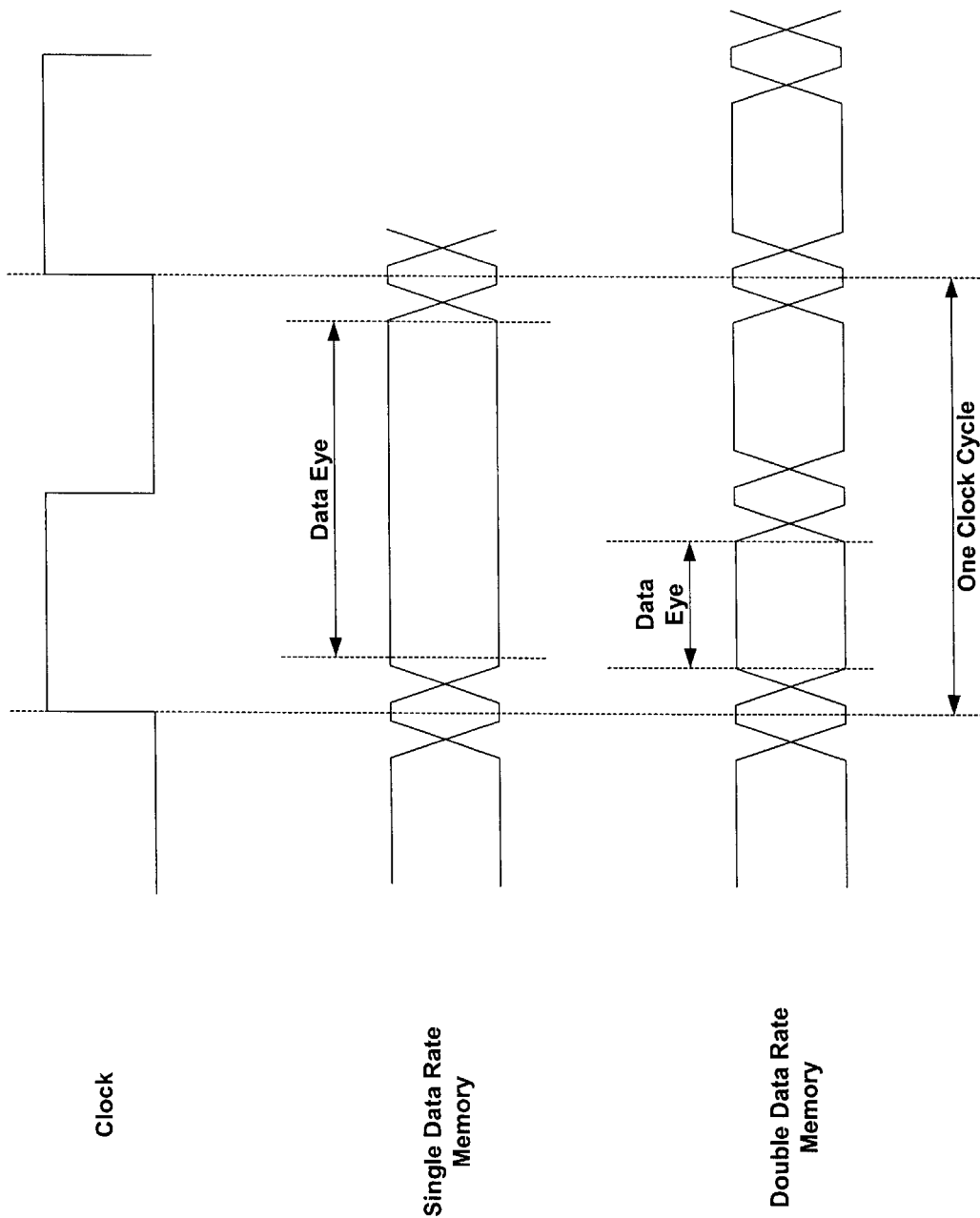
Figure 3B:
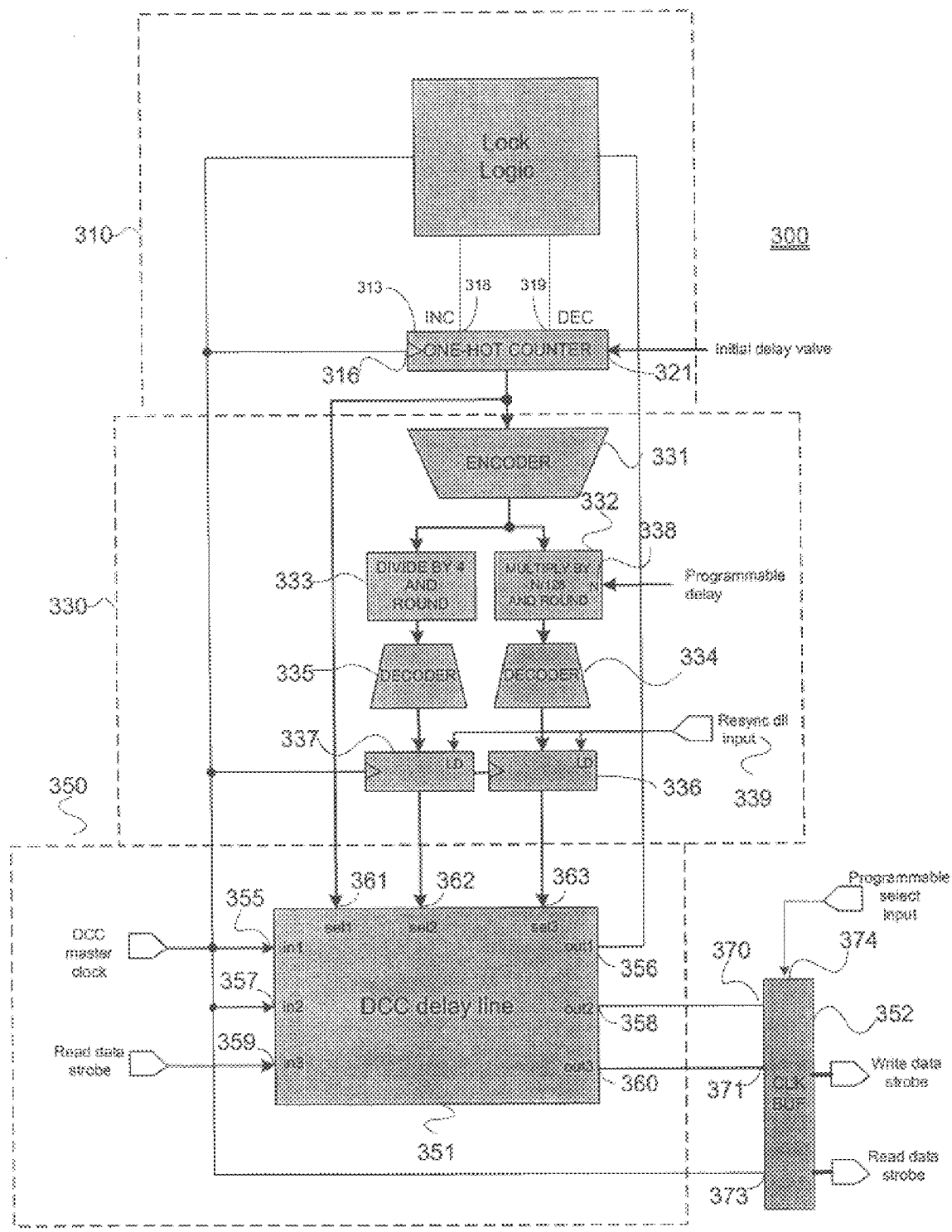
FIG. 3B is a block diagram of delay compensation circuit (DCC) 300.

FIG. 3B is a schematic diagram of one embodiment of a delay compensation circuit (DCC) 300 in accordance with the present invention. In a preferred embodiment, DCC 300 is used in a memory controller that interfaces with an external DDR memory. DCC 300 is used in the memory controller to delay write data strobes so that they align with the data eye of the corresponding write data prior to sending the write data and write data strobe to the DDR memory. The write data strobe is aligned with the data eye of the write data to ensure that the DDR memory can reliably capture the write data and save it in memory. DCC 300 can also be used to delay read data strobes received in conjunction with read data from the DDR memory. Typically the read data strobe is received coincident with the read data. In other words, the rising edge of the read data strobe is aligned with the transition of the read data. In order to reliably capture the read data, the rising and falling edges of the read data strobe are aligned with the data eye of the read data as illustrated in FIG. 1B.

FIG. 3B is divided into three blocks labeled 310, 330 and 350 which perform the steps 210, 220, 230 and 240 described above. The circuitry of block 310 determines the number of delay elements needed to capture a clock cycle of a reference clock signal. Block 330 receives a programmable delay value and calculates the number of delay elements required to delay a clock signal with the same frequency as the reference clock (in this case a read data strobe) by the programmable delay value. In addition, block 330 calculates the number of delay elements required to delay a clock signal by ¼ of a clock cycle. Block 350 receives the delay values calculated in block 330 and delays input clock signals by the appropriate delay values. While the discussion below refers to dealying clock signals, one skilled in the art will recognize that any input signal can be delayed by DCC 300.

Block 350 comprises DCC delay line element 351. In this embodiment, DCC delay line element 351 receives three clock signals as inputs and a corresponding delay input for each clock signal. Each clock signal is delayed in DCC delay line element 351 by passing the clock signal through the number of delay elements specified by the corresponding delay input. Although this embodiment of DCC delay line element 351 delays three clock signals, one skilled in the art will recognize that DCC delay line element 351 can be scaled to simultaneously delay additional input signals.

In this embodiment, DCC delay line element 351 receives the master clock of DCC 300 (herein referred to as DCC master clock) at inputs 355 and 357 and receives a read data strobe clock signal from a DDR memory at input 359. DCC master clock has the same frequency as the master clock of the DDR memory that DCC 300 is being used to interface with. This is important to the operation of DCC 300 for two reasons. First, DCC master clock input 355 to DCC 300 is a reference clock used to calculate the number of delay elements required to capture an entire clock cycle of a DDR memory clock signal. This number of delay elements is used to calculate the number of delay elements needed to delay the read data strobe received from the DDR memory during a read operation according to the programmable delay input into DCC 300. Second, DCC master clock input 357 to DCC 300 is delayed according to a write delay and output from DCC 300 to the DDR memory as the write data strobe during a write operation. In order for the DDR memory to use the write data strobe, it must be the same frequency as the DDR master clock.

DCC delay line element 351 has three inputs 355, 357 and 359, three select inputs 361, 362 and 363 and three outputs 356, 358 and 360. Input 355 (labeled in1 in FIG. 3B) receives DCC master clock. DCC delay line element 351 delays DCC master clock according to the number of delay elements input to select input 361 (labeled sel1 in FIG. 3B) and outputs the delayed DCC master clock clock at output 356. Output 356 of DCC delay line element 351 is input to block 310 which uses the delayed DCC master clock to determine the number of delay elements needed to capture an entire clock cycle of DCC master clock as described herein.

Input 357 of DCC delay line element 351 (labeled in2 in FIG. 3B) also receives DCC master clock as an input and delays DCC master clock according to the number of delay elements input through select input 362 (labeled sel2 in FIG. 3B) and outputs the delayed clock signal at output 358. As described herein, select input 362 receives a write delay from block 330. The delayed clock signal output from output 358 is used to generate the write data strobe that is sent to the DDR memory during a write operation.

Input 359 (labeled in3 in FIG. 3B) recieves a read data strobe and delays the read data strobe according to the number of delay elements input through select input 363 (labeled sel3 in FIG. 3B) and outputs the delayed clock signal at output 360. The read data strobe is received from the DDR memory during a read operation. As described herein, select input 363 receives a read delay from block 330.

Figure 6:
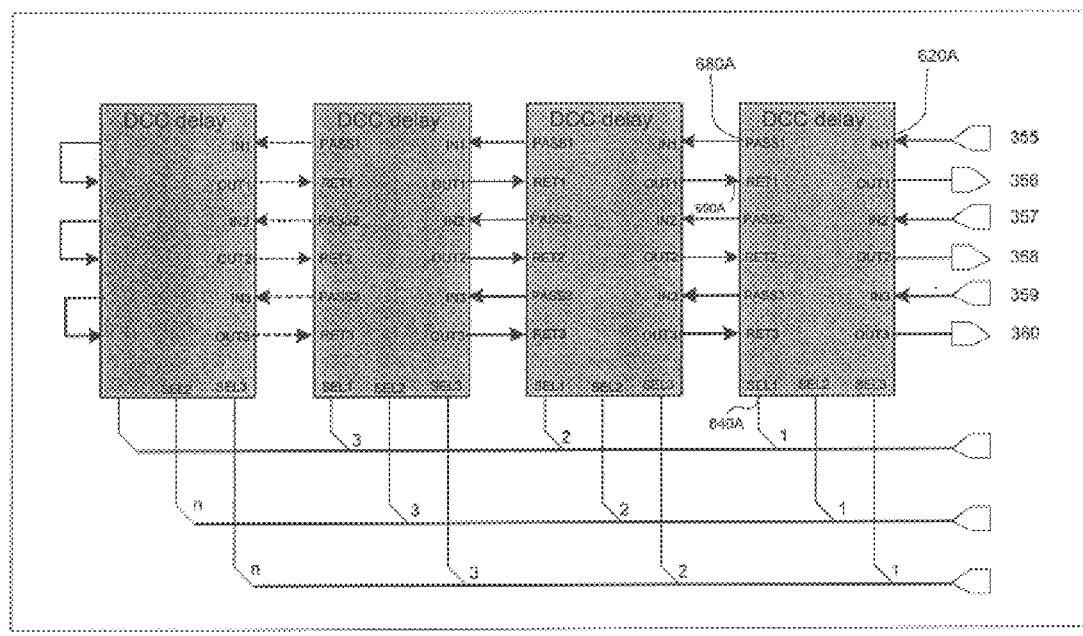
FIG. 6 is a block diagram of DCC delay line element 351 illustrating the delay chains 610 used to delay a clock signal.

DCC delay line element 351 is illustrated in greater detail in FIG. 6. DCC delay line element 351 is comprised of a chain of DCC delays 610A-N (collectively DCC delays 610), which are used to delay the signals input to DCC delay line element 351. Each DCC delay 610 has an input 620, an output 630, a pass output 680, a return input 690 and a select input 640 for each clock signal that is being delayed in DCC delay line element 351.

The chain of DCC delays 610A–N delay the input signals as follows. An input signal is received at input 355 of DCC delay line element 351. This input signal passes into DCC delay 610A at input 620A. DCC delay 610A delays the input signal by one delay element. If DCC delay 610A is the last DCC delay 610 in the chain, the input signal is output of DCC delay 610A through ouput 630A. The input to select line 640A determines if DCC delay 610A is th elast DCC in the chain. If DCC delay 610A is not the last DCC delay 610 in the chain, then the input signal is output through pass output 680A to the next DCC delay 610 in the chain (i.e. DCC delay 610B). This process continues until the input signal has passed through the appropriate number of DCC delays 610. When the input signal reaches the last DCC delay 610, it is returned to the previous DCC delay 610 through output 630 to the return input 690 of the previous DCC delay 610. When the first DCC delay 610A receives the input signal at return input 690A, it passes the input signal to output 630A which is output 356 of DCC delay line element 351.

In one embodiment, the number of DCC delays 610 needed in the delay chain of DCC delay line element 351 is the number of delay elements needed to delay a reference clock signal (such as DCC master clock) by at least one full clock cycle. This number of delay elements can be calculated if the operating frequency of the reference clock signal and the delay time through DCC delay 610 are known. For example, suppose a clock with a frequency of 100 MHz is being used as the reference clock (i.e. DCC master clock) and that each DCC delay 610 provides a delay of 250 ps. In such a system, a delay chain of 40 (10 ns/250 ps=40) DCC delays 610 is needed to capture an entire clock cycle. This is the number of DCC delays 610 that should be included in DCC delay line element 351. It should be mentioned that the number of DCC delays 610 should be calculated according to the lowest frequency clock that might be used with DCC 300 and the fastest rated delay through the delay elements. The number of delay elements should equal the slowest cycle time times the fastest delay through a single element over the best operating conditions.

As illustrated in FIG. 6, there is a separate delay chain for each clock signal that is input into DCC delay line element 351. Thus, DCC delay line element 351 can be scaled to delay additional clock signals by simply adding more delay chains to DCC delays 610. The embodiment illustrated in FIG. 6 has three delay chains, one for each input clock signal. However, one skilled in the art will recognize that DCC delay line element 351 can be scaled to delay many clock signals simultaneously.

Figure 7:
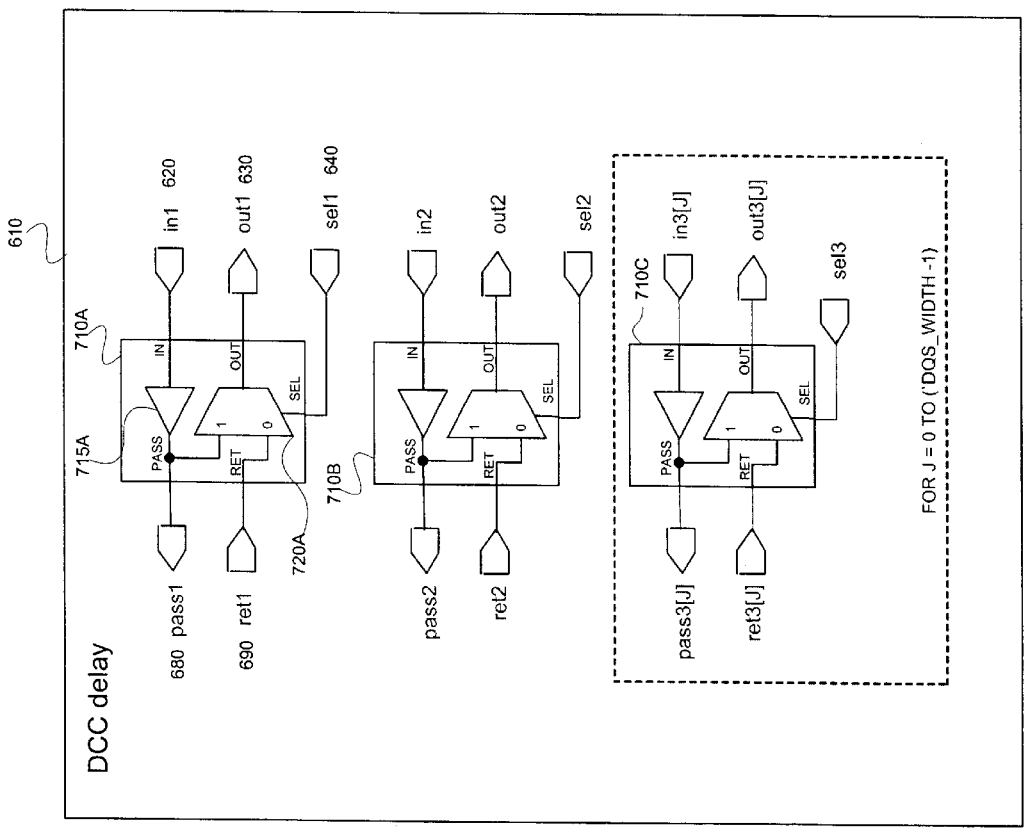
FIG. 7 is a block diagram of DCC delay 610.

FIG. 7 is a block diagram of the circuitry for each DCC delay 610. In this embodiment, DCC delay 610 consists of three DCC delay elements 710A–C, one for delaying each of the three clock signals input to DCC delay line element 351 at inputs 355, 357 and 359. DCC delay element 710 includes a buffer 715 and a MUX 720. These two logic gates, in combination, make up one delay element. Buffer 715 receives a clock signal from input 620 and outputs the clock signal to pass output 680 and to MUX 720 input 721. If DCC delay element 710 is the last DCC delay element 710 that the clock signal needs to be delayed in, then select 640 will be high so that input 721 passes to output 630. If, on the other hand, the clock signal needs to be delayed by additional DCC delay elements 710, then select line 640 will be low and MUX 720 will receive the delayed clock signal at return input 690 (i.e. from the next DCC delay 610 in the chain) and will output the delayed clock signal to oput 630.

The embodiment of DCC delay line element 351 described above delays two DCC master clock signals and one read data strobe. However, DCC delay line element 351 can be configured to accept multiple read data strobes. As described above, in order to delay additional read data strobes, DCC delay line element 351 is scaled to accept more clock signals. This is accomplished by adding the number of DCC delay elements 710 equivalent to the number of additional clock signals that are to be delayed to each DCC delay 610 of DCC delay line element 351. In other words, additional delay chains are added for each additional clock signal that needs to be delayed by DCC delay line element 351.

The input signals delayed by DCC delay line element 351 are output from outputs 356, 358 and 360 respectively. The delayed clock signal output from DCC delay line element 351 at ouput 358 can be used as a write data strobe and the clock signal output 360 is the read data strobe used to capture read data received from a DDR memory. See co-pending U.S. patent application Ser. No. 10/210,859, entitled "Input/Output Cells for a Double Data Rate (DDR) Memory Controller," for an example illustrating how the read data strobe is used to capture the read data from the DDR memory.

As described above, the DCC master clock is delayed in DCC delay line element 351 by a delay value input through select input 361. Delayed DCC master clock is output from DCC delay line element 351 at output 356 to block 310 of DCC 300. The circuitry of block 310 determines the number of delay elements needed to capture a clock cycle of DCC master clock (i.e., the number of delay elements equivalent to the time between the first rising edge of the clock signal and the subsequent rising edge of the clock signal). Since DCC master clock has the same frequency as the master clock used in the DDR memory, the number of delay elements determined in block 310 is the same number of delay elements needed to delay the read data strobe from the DDR memory by one clock cycle.

Figure 9:
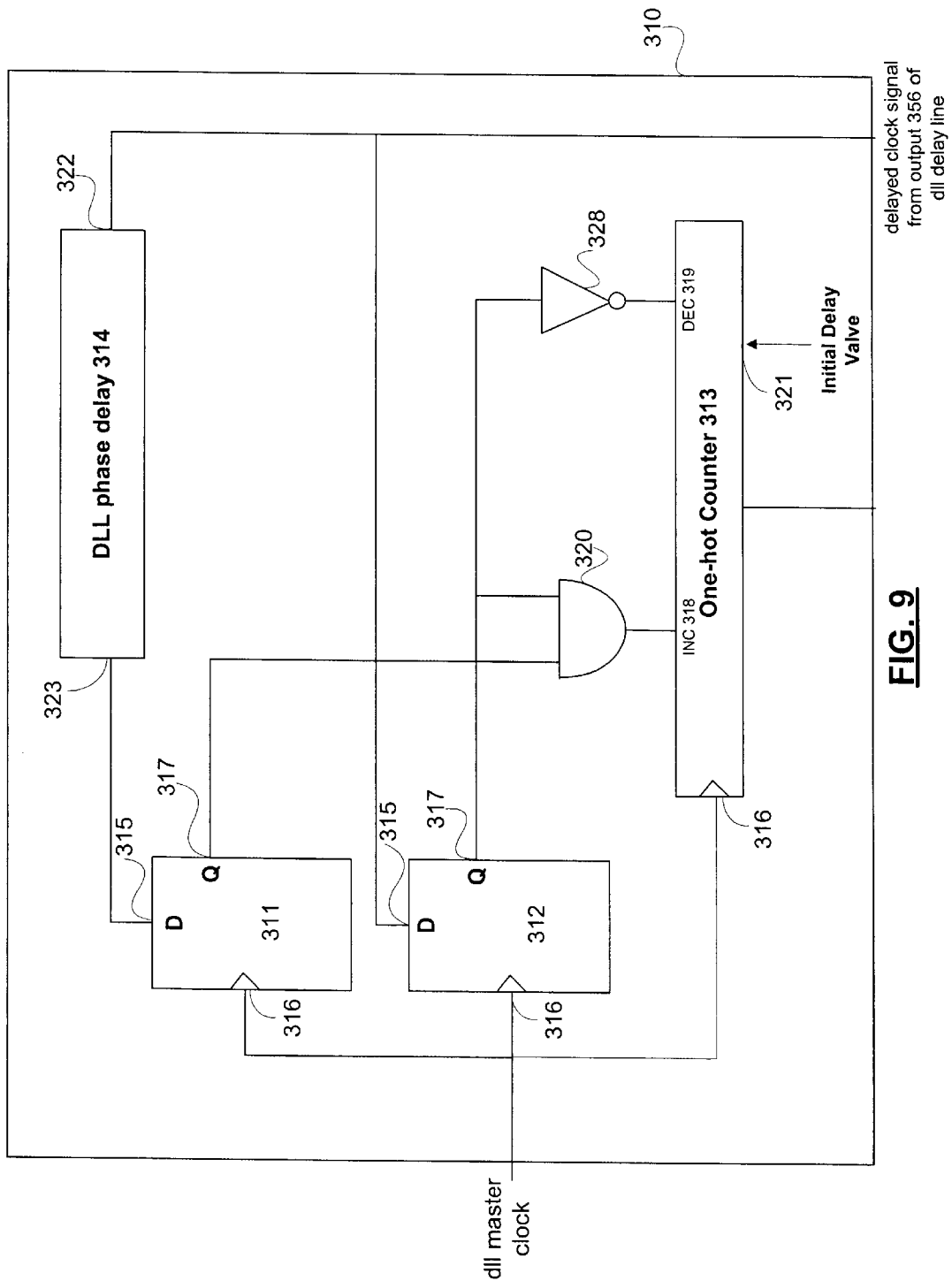
FIG. 9 is an illustration of one embodiment of block 310 of DCC 300.

In one embodiment, illustrated in FIG. 9, block 310 includes two flip flops 311 and 312, a one-hot counter 313, DCC phase delay 314, AND gate 320 and inverter 328. In a preferred embodiment, flip flops 311 and 312 are D-type flip flops. Flip flops 311 and 312 have a data input 315 (labeled D in FIG. 3B), a clock input 316 and a data output 317 (labeled Q in FIG. 3B). The data input 315 of flip flop 311 is coupled to the output of DCC phase delay 314. The data input 315 of flip flop 312 is coupled to output 356 of DCC delay line element 351. The data output 317 of flip flop 311 is coupled to one of the inputs to AND gate 320. The data output of flip flop 312 is coupled to the second input of AND gate 320 and to inverter 328. The output of inverter 328 is coupled to the input of decrement input 314 and the output of AND gate 320 is coupled to increment input 318 of one-hot counter 313. The clock input 316 of flip flops 311 and 312 and one-hot counter 313 receives DCC master clock as its clock input.

Figure 4:
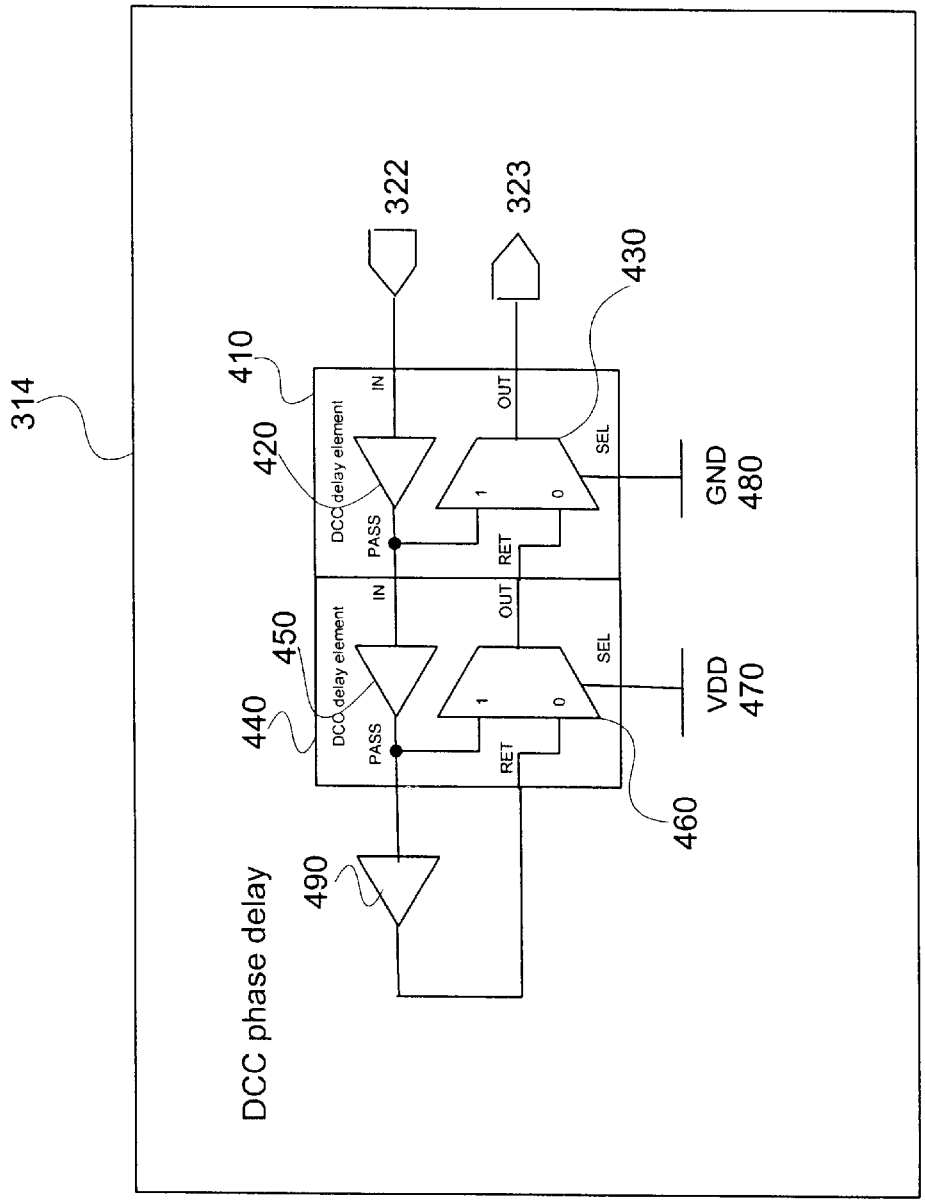
FIG. 4 is a block diagram of DCC phase delay 314.

DCC phase delay 314 has one input 322 and one output 323. Input 322 is coupled to DCC delay line element output 356 and output 323 is coupled to data input 315 of flip flop 311. FIG. 4 is a schematic diagram of DCC phase delay 314. DCC phase delay 314 has two DCC delay elements 410 and 440 connected in series. In a preferred embodiment, DCC delay elements 410 and 440 are the same as the DCC delay elements used in DCC delay line element 351, described above. In one embodiment, DCC delay elements 410 and 440 include a buffer and a multiplexer (MUX). The output of buffer 420 is connected to the input of buffer 450 and one of the inputs to MUX 430. The output of buffer 450 is connected to the input of buffer 490 and one of the inputs to MUX 460. Note that MUX 460 is hard coded to voltage 470 and that MUX 430 is connected to ground 480.

DCC phase delay 314 accepts a clock signal at input 322. The clock signal passes through buffer 420. The clock signal is delayed in buffer 420 before passing to the input of buffer 450. Even though the output from buffer 420 is also connected to MUX 430, the clock signal from buffer 420 will never be output from MUX 430 since the select line for MUX 430 is coupled to a ground. The clock signal passes through buffer 450 which further delays the clock signal. The signal then passes into MUX 460. Since the select line to MUX 460 is hard coded to accept the output from buffer 450, the clock signal passes through MUX 460. The signal proceeds to the second input of MUX 430. The select line for MUX 430 is hard coded to accept the input from MUX 460. Thus, MUX 460 passes the clock signal received from MUX 430 to output 323. Each buffer plus MUX combination constitutes one delay element. Since the input clock signal traverses delay elements 410 and 440, the clock signal is delayed by two delay elements in DCC phase delay 314.

One-hot counter 313 is a counter having a clock input 316, an increment input 318, a decrement input 319 and an initialization input 321. One-hot counter 313 is used to store the number of delay elements required to capture an entire clock cycle. During initilization, one-hot counter 313 is set to an initial value through input 321. This initial value provides the initial number of delay elements that will be used to delay the clock signal input 355 to DCC delay line element 351. The value stored in one-hot counter 313 is adjusted by the circuitry in block 310 until the number of delay elements required to capture an entire clock cycle is determined.

The operation of block 310 will now be described. An initial delay value is input to one-hot counter 313 through initial value input 321. The initial delay value is output to input 361 of DCC delay line element 351. Input 361 specifies the amount of delay applied to DCC master clock input to input 355 of DCC delay line element 351. The delayed DCC master clock is output from DCC delay line element 351 to input 315 of flip flop 312 and input 322 of DCC phase delay 314. DCC phase delay 314 delays the delayed DCC master clock by an additional two delay elements and outputs the delayed DCC master clock to input 315 of flip flop 311. Flip flops 311 and 312 are clocked by DCC master clock. So, when DCC master clock transitions from low to high, the values at the respective inputs 315 of flip flops 311 and 312 are clocked into flip flops 311 and 312.

Figure 5:
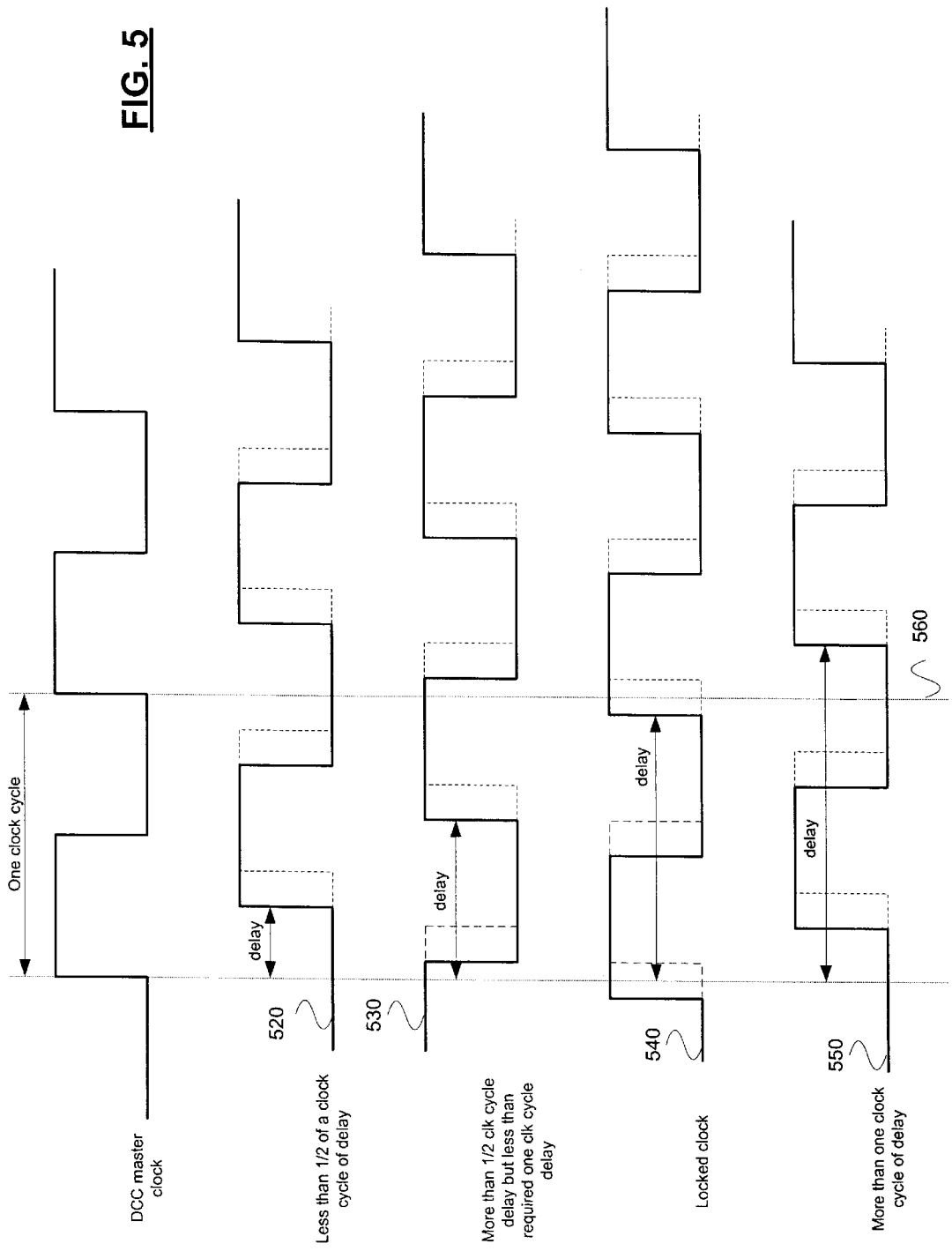
FIG. 5 is an illustration of five clock traces used to illustrate how the lock logic circuitry of FIG. 9 captures a clock cycle of a clock signal.

FIG. 5 illustrates various clock traces that will be used to illustrate how the embodiment of FIG. 9 determines the number of delay elements needed to capture an entire clock cycle of DCC master clock. When DCC master clock transitions from low to high, the values at inputs 315 are clocked into flip flops 311 and 312. This transition is represented by vertical line 560 in FIG. 9. Clock traces 520, 530 540 and 550 are four examples of DCC master clock delayed by various amounts in DCC delay line element 351. The solid line in these traces represents input 315 to flip flop 312 and the dashed line represents input 315 to flip flop 311. Note that the dashed line has been delayed more than the solid line since the input to flip flop 311 passes through the additional two delay elements of DCC phase delay 314.

During a reset or initialization of DCC 300, the initial delay value input 321 to one-hot counter 313 is set to ⅕ the total number of delay elements in a delay chain of DCC delay line element 351. If this initial delay value is insufficient to delay the DCC master clock by ½ of a clock cycle, the circuitry of FIG. 9 will decrease the value stored in one-hot counter 313 to zero as described herein. If this occurs, the initial delay value input 321 to one-hot counter 313 is increased by another ⅕ of the total number of delay elements (⅖ in total) and the process starts again. This process continues until the initial delay value input into one-hot counter 313 is sufficient to delay the clock signal by ½ of a clock cycle. This feature of the embodiment reduces the complexity of the circuitry needed to capture a clock cylce.

Clock trace 520 in FIG. 5 illustrates the case when the initial delay value is insufficient to delay DCC master clock by at least ½ of a clock cycle in DCC delay line element 351. As one can see from FIG. 9, in the case of clock trace 520, the inputs to flip flops 311 and 312 are both low at the intersection of vertical line 560. As a result, the inputs to AND gate 320 are also low resulting in a low output from AND gate 320. Since the increment input 318 receives a low output from AND gate 320, one-hot counter 313 is not incremented. However, decrement input 319 of one-hot counter 313 receives a high input from the output of inverter 328. Therefore, one-hot counter will decrement the number of delay elements in one-hot counter 313 by one resulting in less delay being applied to DCC master clock. When flip flops 311 and 312 are clocked during the next clock cycle of DCC master clock, the clock signals at their respective inputs will have less delay. This will result in a further decrease of the value stored in one-hot counter 313. The amount of delay will continue to decrease until the value of one-hot counter reaches a delay value of zero. When this occurs, the initial value input to one-hot counter 313 will be increased by ⅕ of the total number of delay elements in a delay chain of DCC delay line element 351.

Once an initial delay value is input 321 to one-hot counter 313 sufficient to delay DCC master clock by at least ½ a clock cycle, the circuitry of block 310 will adjust the delay value in one-hot counter 313 until it stores the number of delay elements needed to capture a clock cycle of DCC master clock. Clock trace 530 illustrates a delayed DCC master clock that has been delayed more than ½ a clock cycle but less than a full clock cycle. As illustrated, at the reference point 560, the inputs to flip flops 311 and 312 are high and high. As a result, the output of AND gate 320 is high and one-hot counter 313 is incremented by one. In addition, the input to decrement input 318 is low since the output of flip flop 312 is inverted by inverter 328. Thus, the delay value stored in one-hot counter 313 is incremented by one.

Trace 540 illustrates the case in which the value stored in one-hot counter 313 is the number of delay elements needed to capture a clock cycle of DCC master clock. When DCC master clock transitions from low to high, represented by vertical line 560, the value input to flip flops 311 and 312 at their respective inputs 315 is low for flip flop 311 and high for flip flop 312. These values are also the values at the respective outputs 317 of flip flops 311 and 312. As a result, one of the inputs to AND gate 320 is high and the other is low. Therefore, increment input 318 receives a low input from the output of AND gate 320 and one-hot counter 313 is not incremented. One-hot counter 313 is not decremented either since the high output from flip flop 312 is inverted by inverter 328. The overall number of delay elements used to delay DCC master clock stabilizes when one clock cycle is being captured by the number of delay elements being stored in one-hot counter 313. When the value stored in one-hot counter 313 stabilizes, block 310 continues to monitor th edelaed DCC master clock. Variations in temperature and/or voltage in a delay element can alter the delay the delay element provides to the clock signal. As a result, block 310 continuously updates the value stored in one-hot counter 313.

Clock trace 540 also illustrates the need for the additional two delay elements before the input to flip flop 311. A clock cycle is captured when the input to flip flop 312 transitions from low to high when DCC master clock transitions from low to high. It is difficult to determine exactly when this occurs. In this embodiment of the invention, the exact point is estimated by looking for the point at which the input to flip flop 312 is high and the input to flip flop 311 is low. When this occurs, the number of delay elements stored in one-hot counter 313 is within 2 delay elements of the actual delay value needed to capture a clock cycle.

Finally, trace 550 illustrates the case in which the value of one-hot counter 313 is too high (i.e. DCC master clock is being delayed too much). In this case, the inputs to both flip flops 311 and 312 are low at the intersection of vertical line 560. In this case, the input to increment input 318 is low since the output of AND gate 320 is low. However, the input to decrement input 319 is high since the output of inverter 328 is high. As a result, the value of one-hot counter 313 is decremented. Note that this case is similar to clock trace 520. The difference between the two is that clock trace 550 has been delayed by more than one clock cycle. When the delay applied to clock trace 500 is decreased, the rising edge of clock trace 550 is brought back to vertical line 560. In contrast, when the delay applied to clock trace 520 is decreased, clock trace 520 approaches the original DCC master clock signal (i.e. no delay).

Returning back to FIG. 3B, the number of delay elements stored in one-hot counter 313 is input into block 330 which calculates the number of delay elements required for the read and write delays. Block 330 includes an encoder 331, write delay calculation circuitry 333, read delay calculation circuitry 332, decoders 334 and 335 and buffers 336 and 337. Encoder 331 receives the number of delay elements needed to capture an entire clock cycle from one-hot counter 313. Encoder 331 converts this value into an unsigned integer and outputs the unsigned integer value to delay calculation circuitry 332 and 333.

In one embodiment, write delay calculating circuitry 333 receives the unsigned integer delay value from encoder 331 and divides the delay value by four and rounds the result to the nearest integer value. The resulting write delay value is the number of delay elements required to delay a write clock signal by ¼ of a clock cycle. One skilled in the art will realize that the write delay is not limited to ¼ of a clock cycle.

Write delay calculating circuitry 333 ouputs the write delay value to decoder 335. Decoder 335 receives the integer write delay value and converts it into a one hot vector. For example, a write delay value of 5 is converted to 00010000, a write delay value of 4 is converted to 00001000, a write delay value of 3 is converted to 00000100, etc.

The output of decoder 335 is output to buffer 337 which stores the number of delay elements required to delay a clock signal by ¼ of a clock cycle. While the value in decoder 335 is constantly being updated, in one embodiment, buffer 337 is only updated periodically. In this embodiment, buffer 337 is registered with the new delay values when there is a refresh cycle in the DDR DRAM memory. Due to the DRAM architecture, they must periodically refresh their data or they lose the information stored in the memory. During these refresh cycles, the DRAMs do not read or write data to memory. As a result, no clock signals will be propagating through the DCC during the refresh period. By updating the number of delay elements in buffers 336 and 337 during the refresh cycle, the DCC does not introduce glitch or jitter into clock signals being delayed by the DCC since no clock signals are propagating through the DCC when the refresh is occurring. This is advantageous since this embodiment does not require complicated analog circuitry that is conventionally used to reduce jitter and glitch. When the refresh cycle occurs, resync DCC input 339 is triggered and the ouput of decoder 335 is input into buffer 337.

Read delay calculation circuitry 332 receives the unsigned integer delay value from encoder 331, multiplies the unsigned integer delay value by $n/128$ and rounds the result to the nearest integer value. The value of n is received through input 338, which can be programmed external to read delay calculation circuitry 332. In one embodiment, the programmed value of n is received from a programmable register, but one skilled in the art will recognize that the programmable delay value can be input from a number of sources.

In this embodiment, the read delay is specified in $1/128$ intervals. This is beneficial because it allows DCC 300 to be used with various circuit designs. By allowing the read delay to be programmable in $1/128^{th}$ of a clock cycle intervals, DCC 300 can handle read data for a variety of DDR memories and board designs. Although the embodiment described in FIG. 3B refers to specifying the read delay in intervals of $1/128^{th}$ of a clock cycle, the read delay calculation circuitry can be designed to receive any delay value.

Once the read delay value is calculated by read delay calculating circuitry 332, the read delay value is output to decoder 334. Decoder 334 receives the integer read delay value and converts it into a one hot vector. For example, a read delay value of 5 is converted to 00010000, a read delay value of 4 is converted to 00001000, a read delay value of 3 is converted to 00000100, etc.

The output of decoder 334 is output to buffer 336 which stores the number of delay elements required to delay a clock signal by $n/128^{th}$ of a clock cycle. While the value in decoder 334 is constantly being updated, in one embodiment, buffer 336 only updated periodically. In this embodiment, buffer 336 is registered with the new delay values when there is a refresh cycle as described above. When the refresh cycle occurs, resync DCC input 339 is triggered and the ouput of decoder 334 is input into buffer 336.

The number of delay elements stored in buffers 337 and 336 is output to inputs 362 and 363 of DCC delay line element 351, respectively. As described above, DCC delay line element 351 delays the clock signals according to the number of delay elements received at inputs 362 and 363. In particular, the number of delay elements input into DCC delay line element 351 selects how many DCC delay elements the corresponding clock signal needs to pass through to provide the appropriate delay to the clock signal.

In addition, input 361 of DCC delay line element 351 receives the number of delay elements stored in one-hot counter 313. As described above, DCC master clock, received at input 355, is delayed by the number of delay elements received from one-hot counter 313 and is output from DCC delay line element 351 to block 310.

In one embodiment of the invention, clock buffer 352 is coupled to receive DCC master clock delayed by ¼ of a clock cycle from output 358 of DCC delay line element 351. Clock buffer 352 uses DCC master clock and DCC master clock delayed by ¼ of a clock cycle to create four clock signals, DCC master clock delayed by ¼ clock cycle, DCC master clock delayed by ½ clock cycle, DCC master clock delayed by ¾ clock cycle and DCC master clock as illustrated in FIG. 10. Clock buffer 352 has a programmable select input 374 that selects one of the four clock signals to output as the write data strobe to the DDR memory during a write operation. The clock signal selected by the programmable select input depends on the layout of the memory controller and the DDR memory. For example, if the DDR memory requires that the write data strobe is received at the DDR memory within ¼ of a clock cycle of the rising edge of the DDR master clock, then the appropriate write data strobe can be chosen by the programmable select input 374 based on the flight time between clock buffer 352 and the DDR memory such that the write data strobe will arrive at the DDR memory within the required window.

Figure 8:
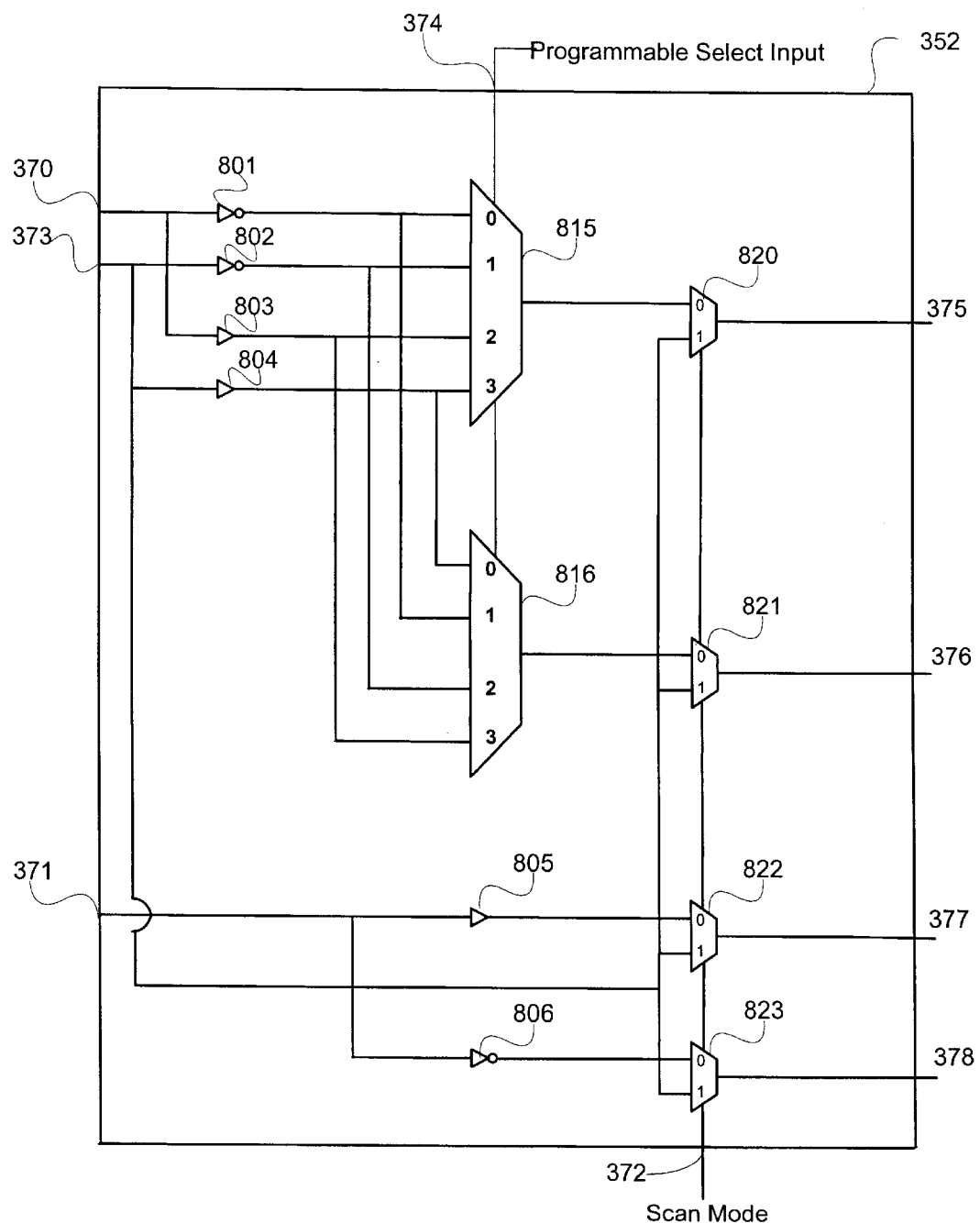
FIG. 8 is a block diagram of clock buffer 352.

Clock buffer 352 is illustrated in greater detail in FIG. 8. Clock buffer 352 has five inputs, labeled 370, 371, 372, 373 and 374 and four ouputs labeled 375, 376, 377 and 378. Clock buffer 352 also consists of three inverters 801, 802 and 806, three buffers 803, 804 and 805, two 4:1 multiplexers 815 and 816 and four 2:1 Multiplexers 820, 821, 822 and 823.

Input 370 receives DCC master clock delayed by ¼ of a clock cycle from output 358 of DCC delay line element 351 and inputs the delayed clock to inverter 801 and buffer 803. The inverted delayed DCC master clock is output from inverter 801 and input into mulitplexers 815 and 816. Buffer 803 receives the delayed DCC master clock and temporarily delays it prior to inputing it into multiplexers 815 and 816. In a preferred embodiment, the delay introduced by buffer 803 is equivalent to the delay introduced by inverter 801 in order to balance the delays experienced by the clock signals.

Input 373 receives DCC master clock and inputs DCC master clock into inverter 802 and buffer 804. The inverted DCC master clock is output from inverter 802 and input to mulitplexers 815 and 816. Buffer 804 receives DCC master clock and temporarily delays DCC master clock and inputs DCC master clock into multiplexers 815 and 816. Again, in a preferred embodiment, the delay introduced by buffer 804 is equivalent to the delay introduced by inverter 802 in order to balance the delays experienced by the data strobes.

In one embodiment, clock buffer 352 receives a scan mode control signal at input 372. The scan mode control signal is input to the select lines for MUXs 820, 821, 822 and 823. DCC master clock is input into the high (or one) input of each MUX 820, 821, 822 and 823. When the scan mode control signal is high, clock buffer 352 operates in scan mode and outputs DCC master clock to outputs 375, 376, 377 and 378. One skilled in the art will recognize that scan mode can be used to test the circuit once it has been fabricated to ensure that there are no flaws in the manufacturing.

As illustrated in FIG. 8, the select input for multiplexers 815 and 816 is identical and is received from input 374. When clock buffer 352 is not operating in scan mode (i.e. the inputs to multiplexers 820, 821, 822 and 823 are low), the outputs of multiplexers 815 and 816 are output through outputs 375 and 376 of clock buffer 352, respectively. Output 376 is the write data strobe sent to a DDR memory during a write operation. Output 375, referred to as write clock, is always ¼ of a clock cycle ahead of the write data strobe output from output 376. In one embodiment, this clock signal is used to register the write data, write data mask and write data strobes in registers at the edge of the interface with the DDR memory. See co-pending U.S. patent application Ser. No. 10/210,858 entitled "Input/Output Cells for a Double Data Rate (DDR) Memory Controller," as an example.

Input 374 of clock buffer 352 receives a two bit select input for MUX 815 and MUX 816. In a preferred embodiment, the select input is programmable. The programmable select input allows the write data strobe output from output 376 to be selected based on the circuit design and the flight time from DCC 300 to the DDR memory. In the embodiment illustrated in FIGS. 3 and 8, the write data strobe is delayed by ¼ of a clock cycle in DCC 300. ¼ of a clock cycle is used in this embodiment because, typically, DDR memories require that the first rising edge of the write data strobe arrive within ¼ of a clock cycle of the rising edge of the master clock in the DDR memory. Clock buffer 352 uses this clock signal and the original DCC master clock to create four clock signals that are in ¼ of a clock cycle intervals. By allowing the controller to select the write data strobe in ¼ increments, the DCC of the present invention can be used with varying circuit designs. For example, based on the flight time between clock buffer 352 and the DDR memory, the appropriate write data strobe can be selected based on which clock signal will reach the DDR within the required window.

It should be noted that the present invention is not limited to DDR memory devices that require the first rising edge of a write data strobe to occur within ¼ of a clock cycle of the rising edge of DDR master clock. One skilled in the art will recognize that the present invention can be used to provide a write data strobe to any DDR memory within the window required by the DDR memory.

Input 371 of clock buffer 352 recieves the delayed read data strobe from output 360 of DCC delay line element 351. The delayed read data strobe is input into buffer 805 and inverter 806. Inverter 806 inverts the delayed read data strobe and inputs the inverted delayed read data strobe into mulitplexer 823. Buffer 805 receives delayed read data strobe and temporarily delays the delayed read data strobe and inputs the delayed read data strobe into multiplexer 822. The delay introduced by buffer 805 is equivalent to the delay introduced by inverter 806 in order to balance the delays experienced by the clock signals.

These two data strobes are used to capture the read data received from the DDR memory in conjunction with the read data strobe. In a preferred embodiment, D-type flip flops are used to capture the bits of data received from the DDR memory during a read operation. However, D-type flip flops only register the data at their inputs when their input clock signal transitions from low to high. The read data strobe and the inverted read data strobe are the clocks used by the D-type flip flops to capture the read data. The read data strobe is used to capture the data received during the positive edge of the read data strobe in a first flip flop. Similarly, the inverted read data strobe is used to capture data received during the negative edge of the read data strobe in a second flip flop. See co-pending U.S. patent application Ser. No. 10/210,858, entitled "Input/Output Cells for a Double Data Rate (DDR) Memory Controller," for an example of the read data capture logic.

One advantage of the present invention is that the programmable nature of the DCC allows the ASIC to be used with varying board designs. In the prior art, the layout of the board design and the distance between the ASIC and the DDR memory required the DCC to be redesigned to compensate for the differences in flight times for the read and write data strobes. By programming the delay in the DCC, the delay can be adjusted in the DCC without requiring the DCC to be redesigned for different board layouts and for varying DDR memory devices.

Another advantage of the present invention is that the delay applied to the read and write data strobes in DCC delay line element 351 comes from buffers 336 and 337 respectively. Since the delay values stored in these buffers are only updated when the DDR DRAM is refreshing its data, the DCC is guaranteed that no read and write data strobes will be propagating through DCC delay line element 351 when the update occurs. This eliminates any potential for glitch or jitter and reduces the complexity of the delay circuit since the analog circuitry normall required to monitor for glitch and jitter is no longer required.

While the invention has been described with reference to preferred embodiments, it is not intended to be limited to those embodiments. It will be appreciated by those of ordinary skilled in the art that many modifications can be made to the structure and form of the described embodiments without departing from the spirit and scope of this invention. For example, the delay compensation circuitry (DCC) described above is not limited to delaying clock signals. The DCC can be used to delay any input signal by a programmable delay value.

What is claimed is:

1. Circuitry for delaying an input signal according to a programmable delay value, comprising:
   clock capturing circuitry for determining a number of delay elements needed to capture a clock cycle of a clock signal with the same frequency as the input signal;
   delay calculation circuitry for:
      receiving the number of delay elements needed to capture the clock cycle from the clock capturing circuitry;
      receiving the programmable delay value; and
      calculating a number of delay elements needed to delay the input signal by the programmable delay value; and
   delay circuitry comprising:
      an input for receiving the input signal;
      a select input for receiving the number of delay elements needed to delay the input signal by the programmable delay value from the delay calculation circuitry; and
      a chain of delay elements, wherein the number of delay elements that the input signal is passed through is determined by the select input.

2. The circuitry of claim 1, wherein the clock capturing circuitry continuously updates the number of delay elements needed to capture the clock cycle.

3. The circuitry of claim 1, wherein the delay calculation circuitry periodically updates the number of delay elements needed to delay the input signal by the programmable delay value.

4. The circuitry of claim 3, wherein the input signal is received from a DRAM memory and the number of delay elements needed to delay the input signal by the programmable delay value is updated during a refresh cycle of the DRAM memory.

5. The circuitry of claim 1, wherein the programmable delay value is received from a programmable register.

6. The circuitry of claim 1, wherein the programmable delay value can be changed for different board designs but does not change over time for the same board design.

7. The circuitry of claim 1, wherein the input signal is a read data strobe received from a double data rate (DDR) memory.

8. The circuitry of claim 1, wherein the delay calculation circuitry calculates the number of delay elements needed to delay the input signal by the programmable delay value by multiplying the programmable delay value times the number of delay elements needed to capture the clock cycle.

9. The circuitry of claim 1, wherein the number of delay elements needed to capture a clock cycle of the clock signal is the number of delay elements that delay the clock signal by an amount equivalent to a time between a first rising clock edge of the clock signal and a subsequent rising edge of the clock signal.

10. The circuitry of claim 1, wherein the delay element is a logic gate.

11. A method for delaying an input signal by a programmable delay value, comprising:
   determining a number of delay elements needed to capture a clock cycle of a clock signal with the same frequency as the input signal;
   receiving a programmable delay value;
   calculating a number of delay elements required to delay the input signal by the programmable delay value; and
   delaying the input signal by the number of delay elements required to delay the input signal by the programmable delay value.

12. The method of claim 11, wherein the number of delay elements required to delay the input signal by the programmable delay value is calculated by multiplying the programmable delay value times the number of delay elements needed to capture a clock cycle of the clock signal.

13. The method of claim 11, wherein the number of delay elements needed to capture the clock cycle is the number of delay elements that delay the clock signal by an amount equivalent to a time between a first rising clock edge of the clock signal and a subsequent rising edge of the clock signal.

14. A method for generating a write data strobe for a write operation to a DDR memory, comprising:
   generating a plurality of clock signals that have the same frequency as a master clock in the DDR memory, each of the plurality of clock signals being delayed by a different amount;
   receiving a programmable input;
   selecting one of the plurality of clock signals as the write data strobe based on the programmable input; and
   outputting the write data strobe.

15. The method of claim 14, wherein the plurality of clock signals are delayed in ¼ clock intervals.

16. Apparatus for delaying an input signal according to a programmable delay value, comprising:
   means for determining a number of delay elements needed to capture a clock cycle of a clock signal with the same frequency as the input signal;
   means for calculating the number of delay elements required to delay the input signal by a programmable delay value; and
   means for delaying the input signal by the number of delay elements required to delay the input signal by the programmable delay value.

17. The apparatus of claim 16, wherein the number of delay elements needed to capture the clock cycle is the number of delay elements that delay the clock signal by an amount equivalent to a time between a first rising clock edge of the clock signal and a subsequent rising edge of the clock signal.

18. Circuitry for delaying a read data strobe received from a dynamic random access memory (DRAM) during a read operation, comprising:
   delay calculation circuitry for receiving a programmable delay value and calculating a number of delay elements the read data strobe needs to be passed through to delay the read data strobe by the programmable delay value; and
   delay circuitry comprising:
      an input for receiving the read data strobe; and
      a chain of delay elements for delaying the read data strobe by the number of delay elements calculated in the delay calculation circuitry.

19. An apparatus for delaying a read data strobe received from a dynamic random access memory (DRAM), comprising:
   an input for receiving the read data strobe; and
   delay circuitry for delaying the read data strobe comprised of a plurality of delay elements, a subset of the plurality of delay elements used to delay the read data strobe by a programmable delay input.

20. The apparatus of claim 19, wherein the number of delay elements needed to delay the read data strobe the by programmable delay input varies over time.

21. The apparatus of claim 20, wherein the number of delay elements is updated in the delay circuitry during a refresh cycle in the DRAM.

* * * * *